(12) United States Patent
Fronczkiewicz et al.

(10) Patent No.: US 9,671,695 B2
(45) Date of Patent: Jun. 6, 2017

(54) PROCESS OF MANUFACTURING FLEXOGRAPHIC PRINTING FORMS

(71) Applicant: Flint Group Germany GmbH, Stuttgart (DE)

(72) Inventors: Peter Fronczkiewicz, Lake Wylie, SC (US); Armin Becker, Großniedesheim (DE)

(73) Assignee: Flint Group Germany GmbH (DE)

( * ) Notice: Subject to any disclaimer, the term of this patent is extended or adjusted under 35 U.S.C. 154(b) by 0 days.

(21) Appl. No.: 14/905,527

(22) PCT Filed: Jul. 14, 2014

(86) PCT No.: PCT/EP2014/065001
§ 371 (c)(1),
(2) Date: Jan. 15, 2016

(87) PCT Pub. No.: WO2015/007667
PCT Pub. Date: Jan. 22, 2015

(65) Prior Publication Data
US 2016/0154308 A1 Jun. 2, 2016

(30) Foreign Application Priority Data

Jul. 15, 2013 (EP) ..................................... 13176465

(51) Int. Cl.
*G03F 7/20* (2006.01)
*G03F 7/09* (2006.01)
*G03F 7/32* (2006.01)
*G03F 7/36* (2006.01)
*G03F 7/40* (2006.01)

(52) U.S. Cl.
CPC ............... *G03F 7/202* (2013.01); *G03F 7/09* (2013.01); *G03F 7/2002* (2013.01); *G03F 7/32* (2013.01); *G03F 7/36* (2013.01); *G03F 7/40* (2013.01)

(58) Field of Classification Search
CPC ....................................................... G03F 7/11
See application file for complete search history.

(56) References Cited

U.S. PATENT DOCUMENTS

| 6,355,395 | B1 | 3/2002 | Zwez et al. |
| 8,158,331 | B2 | 4/2012 | Recchia |
| 2009/0084278 | A1* | 4/2009 | Masi ................. G03F 7/0017 101/32 |
| 2009/0186308 | A1 | 7/2009 | Rudolph |
| 2010/0024672 | A1 | 2/2010 | Vest et al. |
| 2011/0081614 | A1 | 4/2011 | Recchia |
| 2013/0242276 | A1 | 9/2013 | Schadebrodt et al. |

FOREIGN PATENT DOCUMENTS

| DE | 102010031527 A1 | 1/2012 | |
| EP | 654150 A1 | 5/1995 | |
| EP | 1014194 A1 | 6/2000 | |
| EP | 1069475 A1 | 1/2001 | |
| EP | 1457823 A2 | 9/2004 | |
| EP | 2 128 702 A1 | 12/2009 | |
| WO | WO-94/03838 A1 | 2/1994 | |
| WO | WO-2006/124279 A2 | 11/2006 | |
| WO | WO-2010/014293 A1 | 2/2010 | |
| WO | WO 2011106171 A1 * | 9/2011 | ............. G03F 7/201 |
| WO | WO-2011106171 A1 | 9/2011 | |
| WO | WO-2012/010459 A1 | 1/2012 | |

OTHER PUBLICATIONS

International Search Report for PCT/EP2014/065001 mailed Oct. 7, 2014.

* cited by examiner

*Primary Examiner* — Chanceity Robinson
(74) *Attorney, Agent, or Firm* — Drinker Biddle & Reath LLP

(57) ABSTRACT

Process of manufacturing flexagraphic printing firms using digital flexographic printing elements as starting material by imaging, main exposure in the presence of oxygen, development and finishing. The process comprises an additional embossing step in which the surface of the developed printing form is texturized thereby improving the print quality of the printing form.

19 Claims, No Drawings

PROCESS OF MANUFACTURING FLEXOGRAPHIC PRINTING FORMS

CROSS-REFERENCE TO RELATED APPLICATIONS

This application is a national stage application (under 35 U.S.C. §371) of PCT/EP2014/065001, filed Jul. 14, 2014, which claims benefit of European Application No. 13176465.6, filed Jul. 15, 2013, both of which are incorporated herein by reference in their entirety.

The present invention relates to a process of manufacturing flexographic printing forms using digital flexographic printing elements as starting material by imaging, main exposure in the presence of oxygen, development and finishing. The process comprises an additional embossing step in which the surface of the developed printing form is texturized thereby improving the print quality of the printing form.

Flexographic printing is characterized today by a continually increasing demand for higher quality and higher printing press speeds. In order to best match the clarity and resolution of graphic design and artwork, fine highlight detail of desired images must be reproduced with minimal printed dot gain and subtle fades from printed to non-printed areas, and printed solids should show even and smooth ink transfer with high ink densities to expand the printable color gamut.

Printing both subtle highlights and dense, smooth solid images with one printing plate and color is especially challenging for several reasons. First, in order to print fine highlights, a minimal amount of ink and printing impression is desired. But in order to print dense smooth solids, the opposite is desired—more ink and printing impression. For designs that contain both elements, a compromise of desired quality between the highlight areas and solids must be reached where both areas print somewhat less than desired.

Another challenge is realized when performing flexographic printing on smooth substrates such as polyethylene films using digital plates (LAMS) that were exposed in an oxygen rich environment. The oxygen inhibits the polymerization reaction at the surface of the plate, resulting in a very smooth printing surface of the plate, but also sharpened, very small highlight dots. With these features, the small highlight dots on the plate are able to excellently print very light and subtle tones. However, while the resulting smooth surface of solid plate images is a desired texture for printing onto rough substrates, it is a poor surface for transferring ink onto especially smooth substrates, such as films and foils. The result is often a low solid ink density with an uneven, mottled or pin-holed appearance characterized by small areas of inked and non-inked substrate in a more or less random pattern.

In order to improve the ink transfer of digital LAMS plate solids onto smooth substrates, different methods have been used to yield a textured surface on the press-ready plate, but each has disadvantages. For instance, a specialized, rough top surface photopolymer layer (capped plate) can be integrated into the plate construction during manufacturing, and the resulting imaged and processed plate may maintain this texture even with the influence of oxygen inhibition. But this method of plate manufacturing is expensive, very specialized, and difficult to control, and the resulting plate texture can vary in roughness. Furthermore, the surfaces of highlight dots are also textured and may print with darker tones than desired. Lastly, the texture may be suitable for bettering solid ink density and appearance on some substrates but not for others, and it is not possible to alter the inherent roughness to adapt to varying substrate needs.

Another method is to selectively incorporate via software very fine patterns of different shapes, sizes, frequencies, and resolution into the computer image file used to ablate the LAMS layer of the plate. This approach solves the problem of being able to direct which elements of the plate will receive the texturing pattern. It also allows control of the texture properties on the resulting plate surface. But this solution often requires an expensive investment into the software technology used to render and apply the textures into the plate file. Furthermore, the influence of oxygen during main exposure tends to smooth the texture and limits the resolution, frequency and sizes of the pattern elements to rather coarse settings. These coarse patterns often do not yield the desired effect of predictably better solid ink density and appearance and are susceptible to variation in outcomes when other difficult to control variables involved in the printing process change.

To address this problem with limited surface patterning characteristics of digital LAMS plates main exposed in an oxygen rich environment when utilizing software solid screening technology to apply textures to the finished plate surface, different methods have been used to avoid the influence of oxygen during main exposure. If the influence of oxygen inhibition during the main exposure is overcome, then finer, sharper and more exacting textures will be rendered onto the plate surface if present in the LAMS.

US 2009/0186308 A1 discloses processing a flexographic printing element by exposing the element to actinic radiation in an environment of an inert gas (e.g. nitrogen) and a concentration of oxygen between 100 ppm and 190.000 ppm.

WO 2006/124279 A2 discloses a process comprising imaging a film material which is then laminated to a flexographic printing element. The laminated element is exposed to actinic radiation. Oxygen is excluded during the exposure as the imaged film is an effective barrier layer. Eventually the film is peeled off and the relief is generated in a washout process followed by drying the printing form.

U.S. Pat. No. 8,158,331 discloses a method in which oxygen is excluded from the photocurable layer by laminating a film or a barrier layer on top of the imaged mask of a flexographic printing element prior to exposure to actinic radiation.

WO 2012/010459 A2 discloses a process comprising a two-step actinic exposure of imaged flexographic printing elements. The first step comprises an exposure with UV-LED light with a power of >100 mW/cm$^2$, followed by a second exposure step with lower power <100 mW/cm$^2$. In this process the impact of oxygen present in the photocurable layer or the impact of oxygen which might diffuse into the photocurable layer during exposure is eliminated by the high number of photoinitiator radicals which are generated with the high intensity UV-LED exposure.

All the intellectual property rights mentioned above provide methods to achieve higher ink transfer from the plate onto smooth substrates because they allow fine surface textures applied to the image file and rendered by the laser imager into the LAMS layer to form on the plate surface through exclusion of the oxygen effect. Also, by the same mechanism of oxygen exclusion, the profile structure of plate dots change whereby the top of the dot is flat on its entire surface, as opposed to slightly rounded at the edge where the dot structure transitions from the surface to the shoulder—which is caused by oxygen inhibition. This flat dot structure may have some advantages over the rounded edge dot structure in regard to print impression sensitivity in some situations.

However, this dot structure is limited in the performance of printing the finest highlight dots because the benefit of dot sharpening of the finest highlight dots on the plate cannot be realized without oxygen inhibition. Furthermore, plate dot sizes of oxygen exclusion exposed plates are limited to the size limitations of the minimum spot sizes of the imaging lasers used to ablate the plate LAMS layer. Oxygen sharpened highlight dots can be smaller than the spot size of the imaging laser. Another limitation of oxygen excluded exposure and minimum dots is that even if the spot size and dot size can be reduced effectively in the LAMS layer, excessive main exposure time is necessary to effectively hold and support these small dots on the plate. This excessive main exposure time can have an undesirable effect in shadow tones and reverse image areas, and lead to printing problems.

EP 2128702 A1 addresses the need to have different dot structures generated in one flexographic printing element by exposing different areas of the plate with different amounts of UVA light energy. Some elements are exposed to high energy UVA light which again eliminates the effect of oxygen while other elements are exposed to low energy UVA light which allows generation of fine highlight dots making use of oxygen inhibition.

Such a process is difficult to realize because the transfer from flat structures (flat top dots) to rounded structures (rounded dots) is difficult to realize and visible in the print as the thickness of flat elements is slightly higher than the thickness of the rounded elements. Furthermore the software to direct the exposure head to vary the light intensity during the exposure across the plate is expensive and the overall exposure process is rather slow.

WO 2010/014293 A1 discloses a process and an apparatus for thermal development of imagewise irradiated flexographic printing elements. The flexographic printing element is mounted on a conveyor forming a continuous loop which is supported by two rotating cylinders. The apparatus furthermore comprises a heatable cylinder in close proximity to one of the supporting cylinders and a web of an absorbing material is supplied to at least a portion of the heatable cylinder. For thermal development the irradiated flexographic printing element mounted on the conveyor passes once or several times through the nip between the heatable cylinder and said one supporting cylinder. Photopolymerizable material not polymerized melts and is absorbed by the web. In addition, the apparatus comprises a smoothing or roughening roller which contacts the surface of the flexographic printing plate after passing the nip. The smoothing or roughening roller may be heated itself and alters the surface roughness of the printing plate so that the arithmetical mean roughness of the printing plate is changed by at least 5 nm, preferably 10 to 2000 nm. The aim of the treatment is not only to change the arithmetical mean roughness of the printing plate but also to uniformize the surface roughness of the printing plate thus resulting in a better quality of printing. WO 2010/014293 A1 also teaches to use the apparatus comprising the conveyor equipped with a smoothing or roughening roller (however without using the heating cylinder covered with an absorbing web) for smoothing the surface of flexographic printing elements developed using washout solvents.

It was the object of the present invention to provide an improved method for making flexographic printing plates with an improved printing performance. In particular it was the object of the invention to provide a method for making flexographic printing plates using digital LAMS flexographic printing elements as starting material which enables to selectively make plates with the fine highlight features of an oxygen inhibited exposed plate and the fine surface texturizing ability of an oxygen excluded exposed plate, without problems of uneven plate thickness if both exposures are used in various areas of the same plate, and without significant investment into prepress technology.

Therefore, a method for manufacturing flexographic printing forms from flexographic printing elements comprising at least a dimensionally stable support, a photopolymerizable layer and a laser ablatable mask layer has been found, wherein the process comprises at least the steps of:

(i) imaging the laser ablatable mask layer by means of an IR-laser thus obtaining a mask on top of the photopolymerizable layer,
(ii) exposing the photopolymerizable layer with UV-light through the mask obtained in course of step (i) in the presence of atmospheric oxygen,
(iii) removing non exposed parts of the photopolymerizable layer, and
(iv) finishing the polymerized layer by exposure with UVA and/or UVC-light, wherein the process comprises an additional step (v) of embossing the photopolymerized layer between steps (iii) and (iv) or after (iv) by means of an embossing device comprising a textured surface and bringing the textured surface of the embossing device in contact with the surface of the photopolymerized layer at an adjustable pressure wherein the surface of the embossing device has a temperature above room temperature.

In a preferred embodiment of the invention the additional step (v) is performed between steps (iii) and (iv) and the main exposure is performed with UV-light having a low intensity.

Surprisingly, it has been found that by texturizing the surface of an imaged and developed flexographic printing form by means of physical embossing, all the disadvantages of state of the art methods are gone, while all the advantages are kept. Regarding the plate characteristics, the fine and sharp highlights resulting from oxygen influenced exposure are maintained, yet an accurately defined and high frequency surface texture is created on the plate surface, as dictated by the embossing mechanism. As opposed to current methods for texturizing plate surfaces, these features provide the optimum plate characteristics to achieve the best overall print quality—the finest printed highlights, level plate surface, open and clean reverse print areas, and a finely textured surface to improve solid ink density, ink transfer, and appearance. Furthermore, the invention is a very cost effective method for users by eliminating the need for consumables or expensive software.

DESCRIPTION OF THE INVENTION

In the following the term "flexographic printing form" or flexographic printing plate" is used for a previously cross-linked printing form. The term "flexographic printing element" is used in the usual manner for the photopolymerizable starting material which is used for producing flexographic printing forms or flexographic printing plates.

Photopolymerizable Flexographic Printing Elements Used

For the process according to the present invention customary photopolymerizable flexographic printing elements comprising at least a dimensionally stable support, a photopolymerizable, relief-forming layer and a laser ablatable mask layer (also called LAMS layer) are used. Such flexographic printing elements are commercially available.

The photopolymerizable flexographic printing elements used according to this invention can be either plate-shaped flexographic printing elements or cylindrical, preferably continuous seamless flexographic printing elements.

Possible dimensionally stable supports are the supports known to the skilled artisan, for example films, plates or cylindrical tubes. The material of the support can be metals or plastics, such as for instance polyethylene terephthalate. Preferably, the support is transparent for UV radiation.

The photopolymerizable, relief-forming layer comprises in the usual manner at least one elastomeric binder, at least one ethylenically unsaturated monomer and at least one photoinitiator or photoinitiator system and optionally further components such as plasticizers. The binders may for instance be thermoplastic-elastomeric block copolymers such as styrene-isoprene or styrene-butadien block copolymers. Suitable compositions are known to the skilled artisan. The flexographic printing elements may comprise also two or more different photopolymerizable layers of different composition.

The flexographic printing element to be used in the process according to the invention furthermore comprises a laser ablatable mask layer (also called LAMS layer) on top of the photopolymerizable layer. The LAMS layer may be located directly on the photopolymerizable layer of one or more intermediate layers may be in between of them.

LAMS layers are opaque to the wavelength of UV light and usually comprise a binder and at least one IR absorber such as carbon black. Carbon black also ensures that the LAMS layer is opaque. A mask can be inscribed into the LAMS layer by means of an IR laser, i.e. the layer is decomposed and removed at the places at which the laser beam strikes it. Examples for the generation of images on flexographic printing elements using IR-ablative masks are disclosed for example, in EP-A-654 150 or EP-A-1 069 475.

The flexographic printing element may optionally comprise further layers such as for instance adhesion layers or covers sheets.

Process of Manufacturing Flexographic Printing Forms

The process according to the invention comprises at least five process steps (i), (ii), (iii), (iv), and (v).

Step (i)—Imaging

In step (i) the laser ablatable mask layer is imaged by means of an IR-laser. In case the flexographic printing element comprises a cover sheet on the laser ablatable mask layer, the cover sheet is removed before step (i). In course of such imaging, the laser ablatable layer is decomposed and removed at the places at which the laser beam strikes it. Suitable laser devices for performing an imaging step are known in the art and are commercially available. In course of the imaging step a mask on top of the photopolymerizable layer is obtained, i.e. some parts of the photopolymerizable layer are still covered by the opaque laser ablatable mask layer while other parts are no longer covered.

Step (ii)—Main Exposure

In step (ii) the photopolymerizable layer is exposed with UV-light through the mask obtained in course of step (i). The light used may be UVA-light or also UV-VIS-light. Suitable devices for main exposure with UV-light are known in the art and are commercially available. Typical exposure intensities may range from 10 mW/cm$^2$ (typical UVA tube exposure intensity) to 1000 mW/cm$^2$ (typical UV-LED exposure intensity). Preferred is an exposure intensity of <40 mW/cm$^2$. When using such a low intensity oxygen inhibition at the surface of the photopolymerizable layer is significant, and sharpened, very small highlight dots may be obtained.

According to the invention, irradiation with UV-light is performed in the presence of atmospheric oxygen. In course of the main exposure, the photopolymerizable layer polymerizes in those parts of the flexographic printing element which are no longer covered by the opaque laser a blatable mask layer while no polymerization takes place in those parts which are still covered by the mask.

In one embodiment of the invention, UV-light having a high intensity, i.e. an intensity of at least 100 mW/cm$^2$, preferably at least 400 mW/cm$^2$, more preferably at least 800 mW/cm$^2$ is used. Examples of suitable devices providing such a high intensity include devices comprising narrow band of UV LEDs which travel over the plate (e.g. a Nyloflex® NExT exposure frame). When using such a high intensity oxygen inhibition at the surface of the photopolymerizable layer is not very pronounced or may be even absent at all so that flat top dots are obtained.

In another embodiment of the invention, UV-light having a low intensity, i.e. an intensity of less than 100 mW/cm$^2$, preferably less than 40 mW/cm$^2$, more preferably less than 25 mW/cm$^2$ is used. The irradiation intensity may for example be from 15 to 35 mW/cm$^2$. Examples of suitable devices providing such a low intensity include conventional exposure devices comprising UV-tubes. When using such a low intensity oxygen inhibition at the surface of the photopolymerizable layer is significant, and sharpened, very small highlight dots are obtained.

Step (iii)—Development

In step (iii), non-exposed parts of the photopolymerizable layer are removed thus obtained a printing relief layer.

In one embodiment of the invention, the removal may be performed by using suitable washout solutions which dissolve the non-exposed parts of the photopolymerizable layer. Suitable washout solutions are known to the skilled artisan. They may comprise one or more solvents, for example a mixture of hydrocarbon solvents and alcohols. In this embodiment an additional step of drying the plate obtained at increased temperatures, e.g. at from 50° C. to 80° C. usually follows the development step.

In another embodiment of the invention the plate is thermally developed. In course of thermal development, the exposed photopolymerizable layer is covered with a sheet of an absorbent material and heated so that the layer in the unexposed parts of the photopolymerizable layer melts and is absorbed by the absorbent material.

Step (iv)—Finish

In step (iv), the surface of the developed printing form is finished by exposing it to UVC-light. Before the finishing step (iv) the printing form may also be post exposed with UVA-light. In one embodiment of the invention, the printing form may be exposed with both, UVA- and UVC-light.

Step (v)—Embossing

The process according to the invention comprises additional step (v) of embossing the photopolymerized layer by means of an embossing device comprising a textured surface and bringing the textured surface of the embossing device in contact with the surface of the photopolymerized and developed layer at increased temperatures, an adjustable amount of pressure and an adjustable contact time, thereby transferring the device's "male" texture into the "female" plate surface.

The embossing device may be any kind of device. Examples comprise a hard roller or flat platen. Such devices can be made of various materials including steel or ceramics and they may comprise additionally a coating layer of another material such as nickel or sealant.

The surface of the embossing device is textured. The surface may be texturized by techniques known to the skilled artisan, such as molding, mechanical engraving, or laser engraving. The pattern of the textured surface used for embossing according to this invention can be a variety of random or non-random patterns, textures, and elements such as grooves, cells, points.

Depending on different printing variables, the characteristics of embossing patterns—such as shape, size, depth, and frequency—may be more or less effective in regard to improving print quality and printed solid ink density.

For instance, different ink viscosities, anilox roll volumes, ink pigment particle sizes, or substrate roughness may require finer or coarser embossed patterns with shallow or deep textures in order to effectively improve the transfer of ink from printing plate surface to substrate.

For example, a white ink with rather large particles of titanium dioxide may require a coarse, deep texture with bowl shaped elements in order to print with improved print quality, reduction of mottling, and improved opacity. Conversely, a transparent process ink being delivered to the plate with a low volume anilox roll in order to minimize the inking of fine highlight dots may require a very high frequency and shallow texture with truncated pyramid shaped elements in order to maximize the volume of ink that can be received by the plate and subsequently transferred to the substrate. For these reasons, the variety of patterns, textures, and elements may comprise a wide range of design in order to provide an effective improvement in print quality over a wide range of printing variable combinations. An appropriate texture pattern may be selected by the skilled artisan according to his/her needs.

In general however, the basic shapes of desired plate texture patterns consist of non-random repeating elements such as grooves, bowls, inverted pyramids, mounds, pyramids, and truncated pyramids, or fully random "matte" textures. In the case of such regular patterns frequencies from 100 to 2.000 elements per linear cm may be used. Preferred pattern frequencies range from 400 to 800 elements per linear cm. The pattern of repeating non-random elements can be positioned at various angles from 0° to 90° from the horizontal of the printing form mounted in the printing press, however angles of 30°, 45°, or 60° are preferred in order to maintain consistency of pattern angles across the various colors of a complete printing plate set, should the printing forms be embossed parallel to or perpendicular to the future positioning of the form in the printing press. The depth of non-random elements embossed into the printing form is preferably between 1 and 40 μm.

Random pattern textures used as embossing patterns have the appearance of roughened "matte" texture. In the case of such random patterns, the frequency of shapes per linear centimeter cannot be defined, nor can the angle of the pattern to the horizontal of the printing form as mounted in the printing press. Rather, the average peak to valley depth or roughness of the texture should be considered. Preferred roughness values range between 1 and 10 μm.

In order to apply pressure to the surface of the flexographic printing form, the flexographic printing form is backed by a supporting device, such as an impression roller or an impression platen.

The apparatus comprising the embossing device can be of various designs.

In one embodiment of the invention an apparatus is used which comprises at least a heated embossing cylinder and an impression cylinder that form an adjustable nip, and where both cylinders rotate at a controllable speed. In this embodiment the flexographic plate is fed through the nip so that the surface of the plate contacts the heated embossing cylinder's textured surface. Speed of the plate through the nip can be controlled by controlling the rotational speed of the rollers. The pressure on the plate can be controlled by adjusting the gap at the nip. By controlling the speed of the rollers also the contact time between the embossing cylinder and the surface of the plate is controlled.

In one embodiment the embossing cylinder may be from 0.02 m to 1 m in diameter and from 0.5 m to 2.5 m in length.

For cylindrical flexographic printing forms a cylinder type embossing device may be used while the cylindrical printing form is mounted on a cylinder as support. Both cylinders, the embossing cylinder and the cylinder with the mounted flexographic printing form rotate at a controllable speed and the distance between the two cylinders is controllable in order to adjust the pressure.

In another embodiment of the invention, the embossing device is an embossing platen used to impress with controllable pressure its embossed pattern into the flexographic printing form by means of an impression platen or roller on which the back of the flexographic printing from is supported. The embossing platen may have width dimensions from 0.5 m to 1.5 m and length dimensions from 0.5 m to 2.5 m.

In order to aid the transfer of the texture of the embossing device to the surface of the developed printing form while in contact with the printing form's surface heat may be used in addition to applying certain pressure. Heat may be applied by heating the texturized surface of the embossing device as well as heating the surface of the flexographic printing form.

In one embodiment of the invention, at least the texturized surface of the embossing device is heated. The embossing device can be heated in a variety of ways including directly heating the texturized surface for instance with IR-radiation or with hot air, or by internally heating the device, for instance the roller or the platen. Such internal heating may be performed using a heating fluid such as oil flowing through the device or by electrical heat.

The temperature of the surface of the embossing device may be from above room temperature to 200° C., for instance from 25' to 200° C., preferably from 50° C. to 160° C., more preferably from 60° C. to 150° C. and for example from 80° C. to 120° C.

Step (v) may be performed with a heated embossing device and a flexographic printing form at ambient temperatures. In another embodiment of the invention, the surface of the flexographic printing form may be heated prior to contacting the embossing device to assist the embossing process. Such heating may be performed by means of IR-radiation or hot air. Such heating of the surface of flexographic printing form may be used in combination with heating of the embossing device. The surface of the flexographic printing form can be alternately or simultaneously heated to the printing device. If heated, the surface of the flexographic printing device may be heated to temperatures from 30° C. to 100° C., preferably from 40° C. to 80° C.

In one embodiment of the invention the supporting device, such as an impression roller or an impression plate may be chilled. In this embodiment, advantageously it is avoided that the flexographic printing form is damaged in course of embossing with a heated embossing device and/or heating the surface of the flexographic printing form. Such chilling may be performed by using cold air or chilled water. Advantageously, the temperature of the supporting may be controlled to a temperature which is at least 20° C. lower that the temperature of the embossing device. The temperature of the supporting device may be controlled to a temperature from 0° C. and 65° C.

The contact time may be chosen by the skilled artisan according to his/her needs. Typical contact times may range from 0.75 s to 5 s. In case of using cylinder type embossing devices, instead of contact times the embossing speed may be used for describing the embossing process. Suitable embossing speeds may range from 50 mm/min to 500 min/min.

The pressure in course of embossing may be chosen by the skilled artisan according to the type of flexographic printing element and the needs of the printing process. It goes without saying that the minimum pressure needs to be selected that a least a minimal impression into the flexographic printing plate is cause by the embossing device (minimum impression beyond "kiss"). Typical pressures may range from 10 microns to 200 microns of measured impression beyond the first minimal touch of the printing form to the embossing device.

The embossing step (v) is performed after development of the printing form (steps (iii)). It may be performed either between step (iii) and the finishing step (iv) or it may be performed after the finishing step (iv). If the development (step (iii)) was performed using a washout solution, the printing form should preferably to be dried before the embossing step. If the development was performed by thermal development step (v) may follow directly after step (iii).

In a preferred embodiment of the invention, step (v) is performed between the development step (iii) and the finishing step (iv). In this case, the structure is excellently transferred and stabilized in the following finishing step (iv).

The embossing works independently of the technique used for the main exposure of the imaged flexographic printing elements. In a preferred embodiment of the invention, step (iii) is, performed with UV-light having low intensity, i.e. an intensity of less than 100 mW/cm$^2$ such as tube exposure which yields a texturized surface having optimum structure. In an even more preferred embodiment of the invention, step (iii) is performed with UV-light having low intensity and the embossing step (v) is performed before the finishing step (iv).

In case where the embossing step (v) is performed after the finishing step (iv) the apparatus for performing the micro-embossing step (v) may be a stand-alone device with no other function.

In the case where the embossing step (v) is performed before the finishing step (iv) the apparatus for performing the embossing step (v) may of course also be a stand-alone device with no other function. The following finishing step (iv) is then performed in a separate device for finishing and it is necessary to manually transfer the flexographic printing form from device used for embossing to the finishing device.

In a further embodiment of the invention an apparatus which integrates the steps of embossing and finishing is used. In this apparatus, the flexographic printing form directly exits into at least one finishing chamber so that a manual transfer is no longer necessary. In the finishing chamber(s), the printing form is exposed with UV-C-light and optionally also with UV-light. Exposure may be in sequential order, i.e. a first post exposure with UVA-light and then a finishing exposure with UVC-light. In one embodiment of the invention the apparatus is designed so that the post exposing and finishing exposure of the printing form are incorporated into the apparatus, so that the dried plate going in to the apparatus is completely press ready upon exit.

Further Process Steps

The process according to the invention may optionally comprise further process steps.

In one embodiment of the invention the photopolymerizable flexographic printing element comprises a support which is at least partially transparent for UV-radiation and the photopolymerizable layer is back exposed through the support with UV radiation. Such an additional back exposure step may be performed before, after or simultaneously to step (ii), preferably immediately before, after or simultaneously to step (ii).

Advantages of the Invention

The present invention provides a method for making flexographic printing plates using digital LAMS flexographic printing elements as starting material and main exposing them with UV-light in the presence of oxygen. Furthermore, after removal of the non-exposed parts of the photopolymerizable layer an embossing step follows. Such method enables to selectively make plates with the fine highlight features of an oxygen inhibited exposed plate and the fine surface texturizing ability of an oxygen excluded exposed plate, without problems of uneven plate thickness if both exposures are used in various areas of the same plate, and without significant investment into prepress technology.

WO 2010/014293 A1 also teaches to emboss the surface of an exposed and developed plate but only for the purpose of obtaining a more uniform surface roughness. The combination of an embossing process with a main exposure in the presence of oxygen is not taught by the publication.

EXAMPLES

The following examples illustrate the invention.

Examples 1A, 1B, 1C

Main UV-Exposure with Low Intensity, Embossed Before Finishing

Three customary photopolymerizable flexographic printing elements (Nyloflex® ACE Digital 1.70 mm, readily available from Flint Group) 1A, 1B, and 1C were processed as follows:

Step 1: Back Exposure

The flexographic printing elements 1A, 1B, and 1C were each exposed through the polyester back support layer with UVA light with irradiance of 18 to 20 mW/cm$^2$ fir 90 seconds on a Nyloflex® NExT FV Exposure frame.

Step 2: Digital Imaging

The black mask was then ablated with 3.5 J/cm$^2$ of laser energy on an Esko Spark® 5080 imaging device using a digital file test that contained images of solid surfaces, various positive and reverse print elements, as well as dots with various diameters and frequency of 52 dots per linear centimeter (lpc) at various tonal percentages, including fine highlight dots.

Step 3: Main Exposure with UV-Light

The imaged flexographic printing elements were then main exposed using UVA light with irradiance of 18 to 20 mW/cm$^2$ for 600 seconds on a Nyloflex® NExT FV exposure frame in the presence of atmospheric oxygen.

Step 4: Development

The plates were then processed in a Nyloflex® FV Flowline Processor Using Nylosolv® A washout solvent at a temperature of 35° C. and a speed of 225 mm/min.

Step 5: Drying

The plates were then dried for 120 minutes at 65° C. in a Nyloflex® FV Dryer. The plates were removed from the dryer and allowed to cool to room temperature for 15 minutes.

Step 6: Embossing

Plate 1A

Next, a ceramic coated embossing roller mechanism with a laser engraved embossed pattern of hexagonal sided, bowl-shaped cells at a frequency of approximately 400 cells per centimeter (lpc) and a depth of approximately 5 microns was heated to a temperature of 100° C. A gap of approximately 1.6 mm between the heated embossing roller and a support table was created and maintained. The prepared plate 1A was then fed into this nip and pulled through the nip at a speed of approximately 250 mm/min.

Plate 1B

Embossing was performed in the same manner as for plate 1A, however, a ceramic coated embossing roller mechanism with a laser engraved embossed pattern of hexagonal sided, bowl-shaped cells at a frequency of approximately 200 cells per centimeter (lpc) and a depth of approximately 12 microns was used.

Plate 1C

Embossing was performed in the same manner as for plate 1A, however, a chrome coated embossing roller mechanism with a mechanically engraved embossed pattern of square sided, pyramid-shaped cells at a frequency of approximately 140 cells per centimeter (lpc) and a depth of approximately 32 microns was used.

Step 7: Finishing with UVA and UVC Light

The embossed plates 1A, 1B, 1C were then post exposed with 10 minutes of UVA light with irradiance of 10 mW/cm$^2$ and simultaneously detacked with UVC light with irradiance of 20 mW/cm$^2$ for 10 and 6 minutes respectively in a Nyloflex® FV Finisher.

Plate Surface Obtained:

Surprisingly, the inverted pattern of the embossing roller mechanism could clearly be seen on the solid surface of the printing plate as well as the surface of dots and positive printing elements. The pattern was not seen in highlight dots where the diameter of the dot was considerably smaller than the size of the embossing mechanism cell diameters. Furthermore, the highlight dots were not damaged during this process.

Examples 2A, 2B, 2C

Main UV-Exposure with Low Intensity, Embossed after Finishing

Three customary photopolymerizable flexographic printing elements (Nyloflex® ACE Digital 1.70 mm, readily available from Flint Group) 2A, 2B, and 2C were processed as described in examples 1A, 1B, and 1C above, except that the order steps 6 and 7 was inverted, i.e. the plates were finished with UVA and UVC light first and then embossed.

Plate Surface Obtained:

Surprisingly, the inverted pattern of the embossing roller mechanism could be seen on the solid surface of the printing plate as well as the surface of dots and positive printing elements. The pattern was not seen in highlight dots where the diameter of the dot was considerably smaller than the size of the embossing mechanism cell diameters. Furthermore, the highlight dots were not damaged during this process. However, the fidelity of the appearance of the textured pattern on the plate surface was not as defined as the appearance of the plates texturized in Example 1.

Examples 3A, 3B, 3C

Main UV-Exposure with High Intensity, Embossed Before Finishing

Three customary photopolymerizable flexographic printing elements (Nyloflex® ACE Digital 1.70 mm, readily available from Flint Group) 3A, 3B, and 3C were processed as described in examples 1A, 1B, and 1C above, except that the main exposure with UV-light (Step 3) was performed in the following manner:

The plates were then main exposed using UVA light with irradiance of approximately 800 mW/cm$^2$ emitted by a narrow band of UV LEDs traveling over the plate surface at a speed of 150 mm/min at a distance of 10 mm to the plate surface followed by additional main exposure of UVA light with irradiance of 18-20 mW/cm$^2$ for 180 seconds on a Nyloflex® NExT FV exposure frame in the presence of atmospheric oxygen.

Plate Surface Obtained:

Surprisingly, the inverted pattern of the embossing roller mechanism could be seen on the solid surface of the printing plate as well as the surface of dots and positive printing elements. The pattern was not seen in highlight dots where the diameter of the dot was considerably smaller than the size of the embossing mechanism cell diameters. Furthermore, the highlight dots were not damaged during this process. However, the fidelity of the appearance of the textured pattern on the plate surface was not as defined as the appearance of the plates texturized in Example 2.

Examples 4A, 4B, 4C

Main UV-Exposure with High Intensity, Embossed after Finishing

Three customary photopolymerizable flexographic printing elements (Nyloflex® ACE Digital 1.70 mm, readily available from Flint Group) 3A, 3B, and 3C were processed as described in examples 1A, 1B, and 1C above, except that the main exposure with UV-light (Step 3) was performed in the following manner:

The plates were then main exposed using UVA light with irradiance of approximately 800 mW/cm$^2$ emitted by a narrow band of UV LEDs traveling over the plate surface at a speed of 150 mm/min at a distance of 10 mm to the plate surface followed by additional main exposure of UVA light with irradiance of 18-20 mW/cm$^2$ for 180 seconds on a Nyloflex® NExT FV exposure frame in the presence of atmospheric oxygen. Furthermore, the order steps 6 and 7 was inverted, i.e. the plates were finished with UVA and UVC light first and then embossed.

Plate Surface Obtained:

Surprisingly, the inverted pattern of the embossing roller mechanism could be seen on the solid surface of the printing plate as well as the surface of dots and positive printing elements. The pattern was not seen in highlight dots where the diameter of the dot was considerably smaller than the size of the embossing mechanism cell diameters. Furthermore, the highlight dots were not damaged during this process. However, the fidelity of the appearance of the textured pattern on the plate surface was not as defined as the appearance of the plates texturized in Example 3.

Example 5

Comparative

Main UV-Exposure with Low Intensity, No Embossing

A plate was processed as described in Example 1 above, except that step 6 was omitted, i.e. there was no step of embossing.

The following table 1 briefly summarizes the processing conditions chosen in the examples:

| Examples No. | Main Exposure | Embossing |
| --- | --- | --- |
| 1A, 1B, 1C | low intensity | before finishing |
| 2A, 2B, 2C | low intensity | after finishing |
| 3A, 3B, 3C | high intensity | before finishing |
| 4A, 4B, 4C | high intensity | after finishing |
| 5 | low intensity | — |

Print Trials

General Procedure:

Prepared plates were printed on a wide web flexible packaging press using solvent based cyan ink on white polyethylene film substrate.

The printing results were judged with respect to the following parameters:

Highlight dots, minimum printed dot, solid ink density, and mottling. Table 2 summarizes the results obtained.

The parameter "highlight dots" refers to the roundness and fullness of the printed highlight dot when viewed under normal print inspection magnification. A rating of "Excellent" implies all the inspected dots are round and full highlight dots (less than 10% tonal value) with no evidence of a hollow appearance. A rating of "Good" implies that more than half of the dots are round and full, but the remainder of dots are either not round or hollow. A rating of "Fair" implies that less than half of the dots are round and full, but the remainder of dots are either not round or hollow. A rating of "Poor" implies that all the dots are either not round or hollow.

The parameter "minimum printed dot" applies to the printed dot area resulting from the smallest highlight dots held on the printing form as a percentage of the density of the solid print area. This value was measured using the "Dot Area" function of an X-Rite 528 Spectrodensitometer.

The parameter "solid ink density" applies to the measured reflective printed ink density resulting from solid element areas of the printing form. This value was measured using the "Density" function of an X-Rite 528 Spectrodensitometer in "Absolute Density" mode.

The parameter "mottling" refers to the overall uniformity of solid print when viewed with the unaided eye. A rating of "Excellent" implies that the solid print areas appear homogenous, smooth and uniform with no appearance of pin-holing or mottling, and no density or color variation. A rating of "Good" implies that the solid print areas appear homogenous, smooth and uniform with no appearance of pin-holing or mottling, but with some density or color variation. A rating of "Fair" implies that the solid print areas do not appear homogenous, smooth and uniform, and also present with pin-holing or mottling, but with no density or color variation. A rating of "Poor"" implies that the solid print areas do not appear homogenous, smooth and uniform, and also present with pin-holing or mottling, as well as density and color variation.

TABLE 2

| | Results of print trial | | | | | |
| --- | --- | --- | --- | --- | --- | --- |
| No. | Main Exposure | Embossing | Highlight dots | Minimum printed dot | Solid ink density | mottling |
| 1B | low intensity | before finishing | excellent | 5% | 1.45 | excellent |
| 2B | low intensity | after finishing | excellent | 5% | 1.35 | good |
| 5 (comparative) | low intensity | — | excellent | 5% | 1.25 | fair |

The results demonstrate that embossing significantly improves the printing quality of the flexographic printing plates. The results are improved when the plate is embossed before finishing and also improved when the plate is embossed after finishing.

The improvements are more pronounced if the step of embossing is performed before finishing.

The invention claimed is:

1. A process of manufacturing flexographic printing forms from a flexographic printing element comprising at least a dimensionally stable support, a photopolymerizable layer and a laser ablatable mask layer at least comprising the steps of:
   (i) imaging the laser ablatable mask layer by means of an IR-laser thus obtaining a mask on top of the photopolymerizable layer,
   (ii) exposing the photopolymerizable layer with UV-light through the mask obtained in course of step (i) in the presence of atmospheric oxygen, whereby a photopolymerized layer is obtained,
   (iii) removing non exposed parts of the photopolymerized layer using a suitable washout solvent, and
   (iv) finishing the photopolymerized layer by exposure with UVA- and/or UVC-light,
   wherein the process comprises an additional step (v) of embossing the photopolymerized layer between steps (iii) and (iv) or after (iv) by means of an embossing device comprising a textured surface and bringing the textured surface of the embossing device in contact with the surface of the photopolymerized layer at an adjustable pressure wherein the surface of the embossing device has a temperature above room temperature, wherein the embossing device is a cylinder type embossing device or an embossing platen.

2. The process according to claim 1, wherein the process further comprises an additional drying step (iiia) which is performed after step (iii).

3. The process according to claim 1, wherein in step (iii) the non-exposed parts of the photopolymerizable layer are removed by thermal development.

4. The process according to claim 1, wherein step (v) is performed between steps (iii) and (iv).

5. The process according to claim 1, wherein step (ii) is performed with UV-light having an intensity of less than 100 mW/cm$^2$.

6. The process according to claim 5, wherein step (ii) is performed using UV-tubes.

7. The process according to claim 1, wherein the embossing device has a temperature from 80° C. to 120° C.

8. The process according to claim 1, wherein the surface of the flexographic printing form is heated to a temperature from 30° C. to 100° C. prior to contacting the embossing device.

9. The process according to claim 8, wherein an apparatus is used which comprises at least a heated embossing cylinder and an impression cylinder that form an adjustable nip, and where both cylinders rotate at a controllable speed.

10. The process according to claim 9, wherein the apparatus comprises additional means for heating the surface of the flexographic printing form prior to contacting the embossing cylinder.

11. The process according to claim 10 whereby the impression cylinder is chilled.

12. The process according to claim 1, wherein the apparatus used comprises at least a heatable embossing platen and an impression platen or roller on which the back of the flexographic printing form is supported.

13. The process according to claim 1, wherein the apparatus comprises additional means for heating the surface of the flexographic printing form prior to contacting the embossing platen.

14. The process according to claim 12, whereby the impression platen or roller is chilled.

15. The process according to claim 1, wherein the surface of the embossing device is texturized with a random "matte" texture.

16. The process according to claim 15, wherein the texture has a roughness value ranging from 1 to 10 µm.

17. The process according to claim 1, wherein the surface of the embossing device is texturized with a frequent pattern which comprises from 100 to 2,000 elements per linear cm.

18. The process according to claim 17, wherein the frequent pattern comprises from 400 to 800 elements per linear cm.

19. The process according to claim 4, wherein an apparatus which integrates the steps of embossing (v) and finishing (iv) is used, and after embossing the flexographic printing form directly exits into at least one finishing chamber so that a manual transfer is no longer necessary.

* * * * *